(12) United States Patent
Hagenaar et al.

(10) Patent No.: US 11,968,784 B2
(45) Date of Patent: Apr. 23, 2024

(54) CAPACITOR ASSEMBLY

(71) Applicant: PRODRIVE TECHNOLOGIES INNOVATION SERVICES B.V., Son en Breugel (NL)

(72) Inventors: Michel Alexander Hagenaar, Son (NL); Nilles Henricus Vrijsen, Son (NL); Roel Ten Have, Son (NL)

(73) Assignee: PRODRIVE TECHNOLOGIES INNOVATION SERVICES B.V., Son en Breugel (NL)

( * ) Notice: Subject to any disclaimer, the term of this patent is extended or adjusted under 35 U.S.C. 154(b) by 219 days.

(21) Appl. No.: 17/763,511

(22) PCT Filed: Sep. 23, 2020

(86) PCT No.: PCT/EP2020/076586
§ 371 (c)(1),
(2) Date: Mar. 24, 2022

(87) PCT Pub. No.: WO2021/058577
PCT Pub. Date: Apr. 1, 2021

(65) Prior Publication Data
US 2022/0377899 A1 Nov. 24, 2022

(30) Foreign Application Priority Data
Sep. 24, 2019 (NL) .................................... 2023889

(51) Int. Cl.
*H05K 1/18* (2006.01)
*H01G 2/06* (2006.01)
*H05K 1/02* (2006.01)

(52) U.S. Cl.
CPC ............ *H05K 1/181* (2013.01); *H01G 2/065* (2013.01); *H05K 1/0298* (2013.01);
(Continued)

(58) Field of Classification Search
CPC ............... H05K 1/181; H05K 1/0298; H05K 2201/09227; H05K 2201/09236; H05K 2201/10; H01G 2/065
(Continued)

(56) References Cited

U.S. PATENT DOCUMENTS

| 2015/0351231 A1* | 12/2015 | Lee | ..................... | H05K 1/0271 29/842 |
| 2020/0235466 A1* | 7/2020 | Maccabe | ................ | H01Q 13/08 |
| 2020/0288570 A1* | 9/2020 | Jung | .................... | H05K 1/0326 |

FOREIGN PATENT DOCUMENTS

| EP | 3300462 A1 | 3/2018 |
| JP | 2008277361 A | 11/2008 |

OTHER PUBLICATIONS

International Search Report and Written Opinion of the International Searching Authority from the European Receiving Office in PCT/EP2020/076586 dated Jan. 12, 2021, which is an international application corresponding to this U.S. application.

* cited by examiner

*Primary Examiner* — Andargie M Aychillhum
(74) *Attorney, Agent, or Firm* — Kolitch Romano Dascenzo Gates LLC (57) ABSTRACT

Capacitor assembly, comprising a printed circuit board comprising a first conductive trace and a second conductive trace, and a first row of capacitors comprising a plurality of surface mounted capacitor elements. Each of the plurality of surface mounted capacitor elements comprises a pair of outer electrodes, one of the pair being mounted to the first conductive trace and defining a first junction, and the other one being mounted to the second conductive trace defining a second junction. The first junction and the second junction define a first capacitor longitudinal axis. The first conductive
(Continued)

trace has a first current flow direction with a first oblique angle relative to the first capacitor longitudinal axis.

20 Claims, 5 Drawing Sheets

(52) U.S. Cl.
CPC ............ *H05K 2201/09227* (2013.01); *H05K 2201/09236* (2013.01); *H05K 2201/10015* (2013.01)

(58) Field of Classification Search
USPC ........................................................ 361/760
See application file for complete search history.

FIG 7

CAPACITOR ASSEMBLY

TECHNICAL FIELD

The present disclosure is related to an assembly of capacitors arranged on a printed circuit board, in particular to an assembly of surface mounted capacitors. Particularly, the present disclosure is related to capacitor assemblies for use in resonant tank (LC) circuits.

INTRODUCTION

Resonant inductive power transfer can be accomplished by means of inductively coupled resonant circuits or tank circuits comprising an inductor and a capacitor. In applications where high power is being transferred, for instance used for the contactless transfer of electrical energy, it may be beneficial to place multiple surface mounted capacitors on a printed circuit board (PCB) that jointly act as a single capacitor. Since (a high amount of) power will flow through these multiple capacitors, it is important that current density through the conductive traces connecting the capacitors is homogeneous.

Figure 1:
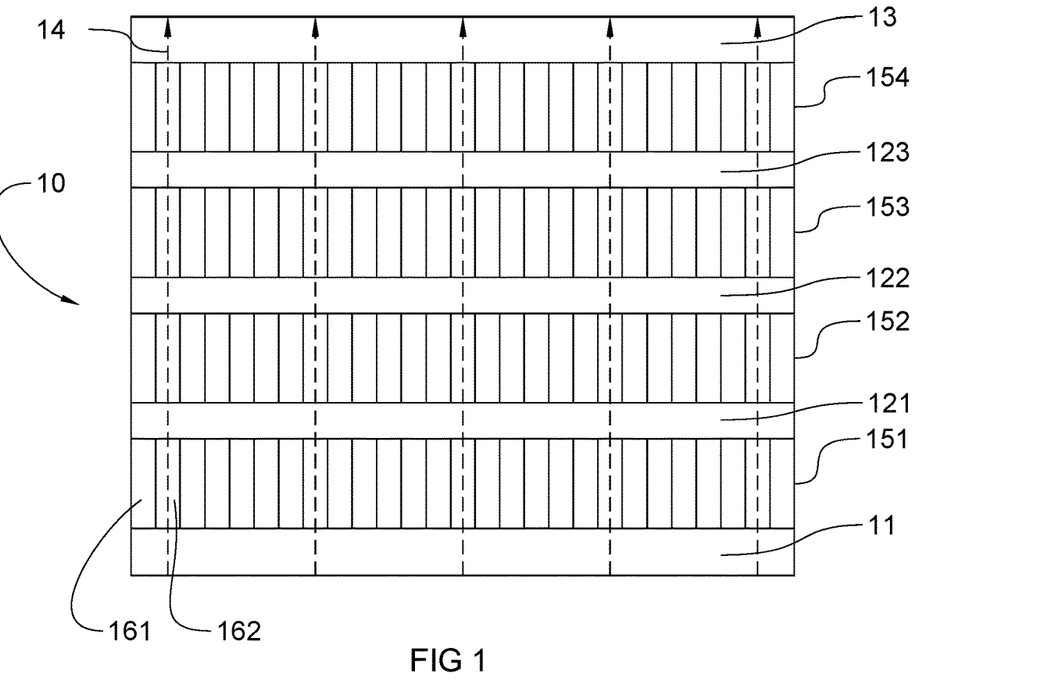
FIG. 1 represents an arrangement of surface mounted capacitors according to the prior art.

It is known that these multiple capacitors can be arranged on PCB's in parallel and/or in series for scaling in terms of current and/or voltage requirements, respectively (see FIG. 1). Such a capacitor assembly 10 typically comprises rows 151, 152, 153, 154 of parallel connected and parallel aligned surface mounted capacitors 161, 162. These rows 151, 152, 153, 154 are coupled in series by means of conductive traces 121, 122, 123. The capacitor assembly 10 further comprises a source junction 11 and a sink junction 13 running in parallel to the conducting traces 121, 122, 123 and arranged for allowing a current to flow through the capacitor assembly 10 in a main direction 14.

One disadvantage of using such an arrangement is that the current and voltage rating of the capacitor assembly influences the form factor such as the size and shape of the PCB.

SUMMARY

It is an aim of the present disclosure to provide a capacitor assembly, which overcomes the above drawbacks. It is an aim of the present disclosure to provide a capacitor assembly, which allows for optimizing PCB design, in particular in terms of form factor and/or current density uniformity. It is an aim of the present disclosure to provide a capacitor assembly allowing for mounting the capacitors in spaces with difficult, e.g. irregular, geometrical constraints.

An electrical circuit according to the present disclosure comprises one or more capacitor assemblies as described herein which are coupled to an inductor to form a resonant tank circuit.

A capacitor assembly comprises a first row of capacitors formed of a plurality of surface mounted capacitor elements and arranged on a printed circuit board. Each of the surface mounted capacitor elements comprises a pair of outer electrodes with the respective capacitor element mounted between the pair of outer electrodes. The pair of outer electrodes are mounted respectively to a first conductive trace and a second conductive trace of the PCB, and define a first junction and a second junction, respectively, of each of the surface mounted capacitor elements. The first junction and the second junction define a first capacitor longitudinal axis. The capacitor elements of the first row of capacitors have parallel capacitor longitudinal axes.

The capacitor assembly advantageously further comprises a second row of capacitors formed of a plurality of surface mounted capacitor elements and arranged on the printed circuit board. Each of the surface mounted capacitor elements of the second row of capacitors comprises a pair of outer electrodes with the respective capacitor element mounted between the pair of outer electrodes. The pair of outer electrodes are mounted respectively to the second conductive trace and a third conductive trace of the PCB, and define a third junction and a fourth junction, respectively, of each of the surface mounted capacitor elements of the second row of capacitors. The third junction and the fourth junction define a second capacitor longitudinal axis. The second row of capacitors are hence arranged electrically in series with the first row of capacitors.

According to the present disclosure, the first row of capacitors is arranged in a skewed orientation with respect to either one or both of: a first main current path in the first conductive trace and a second main current path in the second conductive trace. In other words, the current through the first conductive trace advantageously has a first (main) current flow direction oriented at a first oblique angle relative to the first capacitor longitudinal axis. Advantageously, the current through the second conductive trace has a second (main) current flow direction oriented at a second oblique angle relative to the first capacitor longitudinal axis. Advantageously, the second row of capacitors is arranged in a skewed orientation with respect to the second (main) current flow direction. The second (main) current flow direction is advantageously oriented at a third oblique angle relative to the second capacitor longitudinal axis.

The first oblique angle and the third oblique angle advantageously have equal absolute magnitude. The first oblique angle and the third oblique angle can have same sign (sense) or opposite sign (sense). Advantageous absolute magnitudes for one or more of the first, the second and the third oblique angles are between 20° and 70°, advantageously between 30° and 60°.

The second junction and third junction are advantageously located at opposite ends of the second conductive trace. The second (main) current flow direction can be defined as a straight line between outer electrodes of corresponding capacitor elements at the second junction and the third junction. Generally, a (main) current flow direction can be defined between electric junctions arranged at opposite ends of a conductive trace, e.g. the junctions of consecutive capacitor rows, or the source junction or sink junction of the capacitor assembly on one end and the junction of a capacitor row that faces the source junction or the sink junction on the other end.

Advantageously, a (main) current flow direction, such as the first or second current flow directions, can be parallel to a centreline of the respective conductive trace. The centreline extends along a longitudinal axis of the conductive trace. The conductive trace can have lateral longitudinally extending edges and the centreline can be parallel to one or both lateral longitudinally extending edges. The first and second (main) current flow directions are advantageously parallel.

Advantageously, a (main) current flow direction can be parallel to an axis of the PCB. An axis of the PCB can be parallel to an edge of the PCB.

The above concept can be extended and one or more additional rows of capacitors can be provided on the same PCB electrically in parallel with the first row of capacitors and optionally the second row of capacitors. The one or more additional rows of capacitors are advantageously arranged on the PCB in a same manner as the first and second row of capacitors respectively, i.e. the one or more additional rows of capacitors can have capacitor longitudinal axes and respective first, second and optionally third conductive traces oriented at a same angle or at an inverse angle (same absolute magnitude, opposite sign) as respectively the first row of capacitors and the second row of capacitors.

Alternatively, or in addition, one or more additional rows of capacitors can be arranged on the same PCB electrically in series with the first row and the second row of capacitors. The one or more additional rows of capacitors can be arranged in a same manner as the first or second row of capacitors, i.e. the conductive traces connected to the one or more additional rows of capacitors can have current flow directions relative to the capacitor longitudinal axes of the one or more additional rows of capacitors oriented at a same angle or at an inverse angle as the first and second oblique angles. Advantageously, the conductive traces coupling consecutive rows of capacitors are arranged to have parallel current flow directions.

Advantageously, the first and second rows of capacitors and the one or more additional rows of capacitors form a repeating sequence of electrically series coupled capacitor arrangements. A capacitor arrangement is e.g. formed by the first row of capacitors, the second row of capacitors, the first conductive trace, the second conductive trace and the third conductive trace. A plurality of this capacitor arrangement can be consecutively arranged on the PCB to form the repeating sequence of capacitor arrangements. For instance, the first conductive trace of the capacitor arrangement at one position in the sequence is formed by the third conductive trace of the capacitor arrangement at a preceding position in the sequence.

A capacitor assembly according to the present disclosure wherein the row of capacitors is arranged in a skewed orientation with respect to the main current path provides a solution for the disadvantage indicated above, because it enables to alter the form factor of the assembly for instance by exchanging length for width resulting in a different length-width ratio, advantageously without significantly affecting the current density homogeneity through the conductive traces of the PCB. Alternatively or additionally, it may provide a means of design freedom in selecting the type of surface mounted capacitors.

BRIEF DESCRIPTION OF THE DRAWINGS

Aspects of the present disclosure will now be described in more detail with reference to the appended drawings, wherein same reference numerals illustrate same features and wherein.

DETAILED DESCRIPTION

Figure 2:
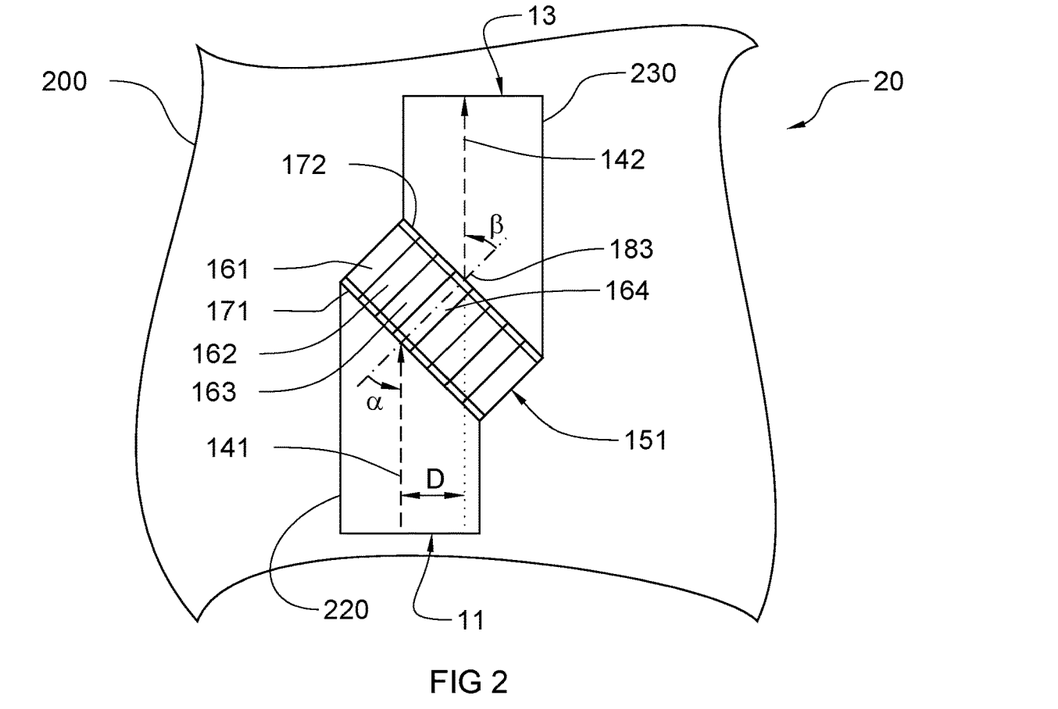
FIG. 2 represents a first embodiment of a capacitor assembly according to the present disclosure formed of a single row of surface mounted capacitors and respective conductive traces of a PCB.

FIG. 2 shows a capacitor assembly 20 comprising a plurality of surface mounted capacitors, of which first four are numbered 161-164, which are arranged in parallel forming a first row 151 of capacitors. The first row 151 of capacitors is coupled to a trace 220 of conductive material on one side that forms the source junction 11 and to a trace 230 of conductive material on the other side that forms the sink junction 13.

The capacitors 161-164 are advantageously rectangular or substantially rectangular parallelepiped capacitor elements and are mounted on a PCB 200. Each capacitor element 161-164 includes a multilayer body including dielectric material layers and internal electrode layers layered in an alternating manner along a predetermined direction between a pair of outer electrodes 171, 172. The capacitor elements 161-164 are disposed near or adjacent to each other and are arranged along a direction parallel or substantially parallel to a main surface of the PCB 200. A main surface of each capacitor element 161-164 that opposes the PCB 200 preferably has a rectangular or substantially rectangular shape including a pair of short sides 182 and a pair of long sides 181.

Figure 7:
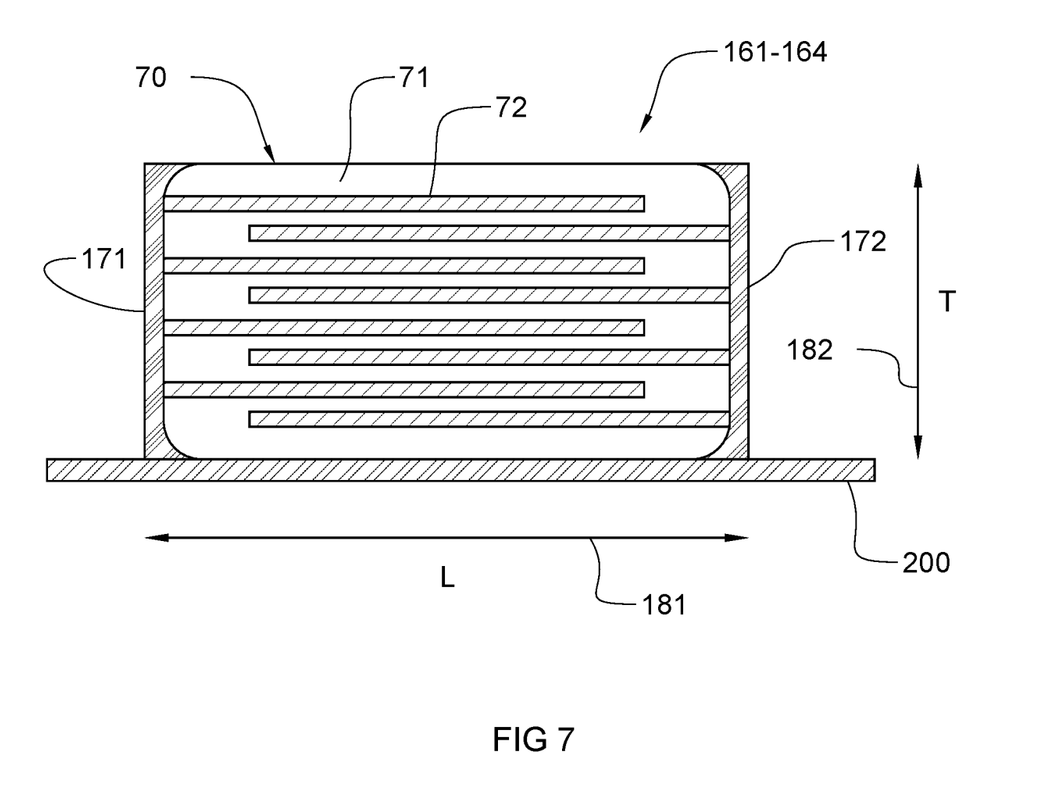
FIG. 7 represents a cross section of a surface mounted capacitor element as may be used in the present disclosure.

Referring to FIG. 7, the multilayer body 70 includes dielectric material layers 71 and inner electrode layers 72 that are layered in an alternating manner along a predetermined direction. The dielectric material layers are preferably formed from a ceramic material that comprises barium titanate, for example, as a main component. Alternatively, other suitable high-permittivity ceramic materials, e.g. comprising $CaTiO_3$, $SrTiO_3$, or the like as a main component, may be selected as the material for the dielectric material layers. The dielectric material layers may include a Mn compound, a Mg compound, a Si compound, a Co compound, a Ni compound, a rare earth compound, or the like as secondary components in a ceramic powder that serves as the raw material of a ceramic sheet. The inner electrode layers can be formed of a metal material such as Ni, Cu, Ag, Pd, an Ag—Pd alloy, Au, or the like. Alternatively, other conductive materials may be selected as the material of the inner electrode layers.

Note that the material of the dielectric material layers 71 is not limited to the aforementioned ceramic material that includes barium titanate as a main component, and another high-permittivity ceramic material may be selected as the material for the dielectric material layers.

The pair of outer electrodes 171, 172 are provided at a distance from each other in a predetermined direction so as to cover the outer surface of both end portions of the multilayer body 70. The multilayer body 70 is therefore interposed between the pair of outer electrodes 171, 172. The pair of outer electrodes can comprise conductive films. The pair of outer electrodes can comprise a layered film including a sintered metal layer and a plating layer, for example. The sintered metal layer is formed by baking a paste such as Cu, Ni, Ag, Pd, an Ag—Pd alloy, Au, or the like. The plating layer is configured of a Ni plating layer and a Sn plating layer that covers the Ni plating layer, for example. The plating layer may be a Cu plating layer, an Au plating layer, or the like instead. In addition, the pair of outer electrodes may be formed of only a plating layer, for example.

Furthermore, a conductive resin paste can also be used for the pair of outer electrodes. Because resin components contained in a conductive resin paste provide an effect of absorbing vibrations produced in the multilayer body, using a conductive resin paste for the pair of outer electrodes makes it possible to effectively dampen vibrations transmitted from the multilayer body to the exterior, which is useful for reducing noise.

A direction in which the pair of outer electrodes 171, 172 are arranged is defined as a length direction L of the capacitor element 161 through 164. A direction in which the dielectric material layers and the inner electrode layers are layered in the multilayer body is defined as a thickness direction T which is perpendicular to L, and a direction perpendicular or substantially perpendicular to both the length direction L and the thickness direction T can be defined as a width direction. The capacitor element 161 through 164 therefore advantageously has a long, narrow, rectangular or substantially rectangular parallelepiped shape in which an outer dimension that follows the length direction L is the largest dimension. Capacitor longitudinal axis 183 can be defined as an axis which is parallel to the length direction L. By construction, longitudinal axis 183 is perpendicular to the width direction and to the thickness direction T.

Referring again to FIG. 2, capacitor elements 161-164 are electrically connected in parallel via a conductive trace pattern provided on the PCB 200. The longitudinal axis 183 of the capacitor therefore extends between the source junction 11 and the sink junction 13 and may be defined by these. Longitudinal axis 183 extends parallel to the long sides 181 of the capacitor elements 161-164.

A first electrical current path 141 can be defined for the first conductive trace 220 and a second electrical current path 142 can be defined for the second conductive trace 230. Current paths 141, 142 determine a current flow direction through the respective conductive trace when the assembly 20 is in use. Advantageously, the current paths 141 and 142 are straight lines, e.g. oriented between electrical junctions provided at opposite sides of the respective conductive trace 220, 230.

According to the present disclosure, at least the first current path 141, and preferably also the second current path 142 are arranged at an oblique angle α, β respectively, relative to the longitudinal axis 183. The angles α, β are advantageously representative of a directional change between the (main) current direction of the first and second current paths 141, 142 respectively and the electrical current direction through the capacitor elements 161-164 which coincides with the longitudinal axis 183. The angles α and β have advantageously equal magnitude, and may have opposite sign.

As a result, it will be appreciated that, unlike the prior art as shown in FIG. 1, the current paths 141 and 142 are offset by a distance D caused by the skewed orientation of the capacitor elements 161-164 with respect to the (main) current paths 141, 142. In addition, by adapting one or more of the angles α, β, the form factor of the capacitor assembly 20 can be modified to obtain a shorter but somewhat wider assembly, enabling the assembly to be incorporated more easily in a desired set up, e.g. of a resonant tank circuit.

Figure 3A:
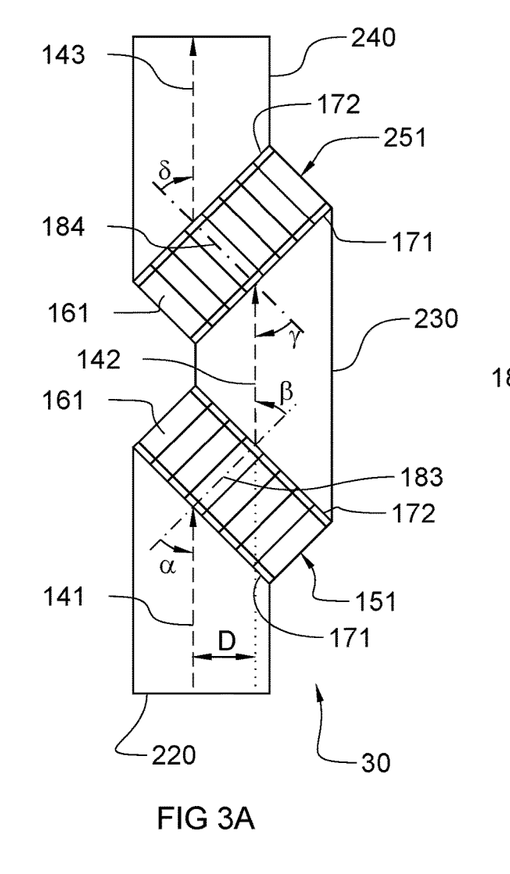
FIGS. 3A and 3B represent embodiments of capacitor assemblies according to the present disclosure, wherein a second row of capacitors is arranged in series with the row of capacitors of FIG. 2.

The pattern of FIG. 2 can be repeated one or multiple times to obtain a larger capacitor assembly. Referring to FIG. 3A, a second row 251 of capacitors is arranged electrically in series with the first row 151. The second row 251 advantageously has an equal number of capacitor elements 161, and which may be of the same type, as the first row 151. The outer electrodes 171 of the capacitor elements of the second row 251 form an electrical junction with the second conductive trace 230. The outer electrodes 172 of the capacitor elements of the second row 251 form a further electrical junction with a third conductive trace 240.

A current path 142 is defined as a straight line between opposite junctions of the second conductive trace 230, i.e. between the outer electrodes 172 of the capacitor elements of the first row 151 and the outer electrodes 171 of the capacitor elements of the second row 251. The capacitor longitudinal axis 184 of the capacitor elements of the second row 251 advantageously has a skew orientation with respect to the current path 142. The angle γ between current path 142 and capacitor longitudinal axis 184 can have, but need not have, equal absolute magnitude as the angle α. Likewise, the angle δ between current path 143 of the conductive trace 240 and capacitor longitudinal axis 184 can have, but need not have, equal absolute magnitude as the angle β. In the case of FIG. 3A, the angles α and γ have opposite sign, as well as the angles β and δ. By so doing, the offset between current path 141 and current path 143 is made very small or zero, but the form factor of the capacitor assembly 30 can be adapted as desired.

Figure 3B:
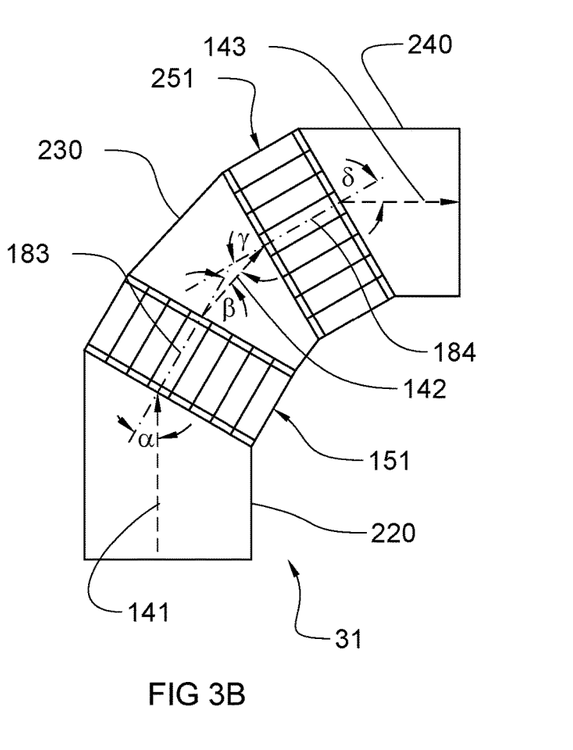

FIG. 3B shows an example in which the angles α and γ on the one hand, and angles β and δ on the other, have equal sign, and possibly equal magnitude. This way, the capacitor rows can form a circular or circle-like configuration, allowing more freedom of design when implanting the capacitor assembly in an electrical circuit.

Figure 4A:
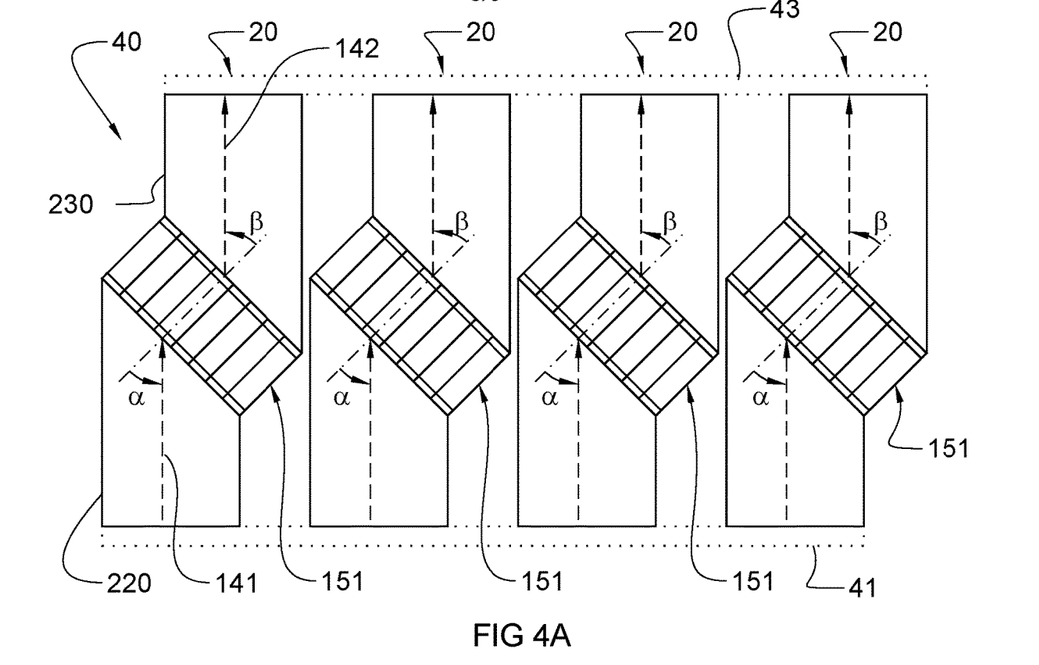
FIG. 4A represents a further embodiment of a capacitor assembly according to the present disclosure, wherein the assembly of FIG. 2 is used as a repeating pattern.

Referring to FIG. 4A, capacitor assembly 40 is obtained by juxtaposition of a plurality of assemblies 20. The capacitor rows 151 are advantageously connected electrically in parallel, with the conductive traces 220 connected to a common source trace 41, and conductive traces 230 connected to a common sink trace 43. It will be convenient to note that the capacitor rows 151 of the different assemblies 20 in capacitor assembly 40 are advantageously skewed with respect to conductive traces 220, 230 at a same oblique angle α, β respectively.

Figure 4B:
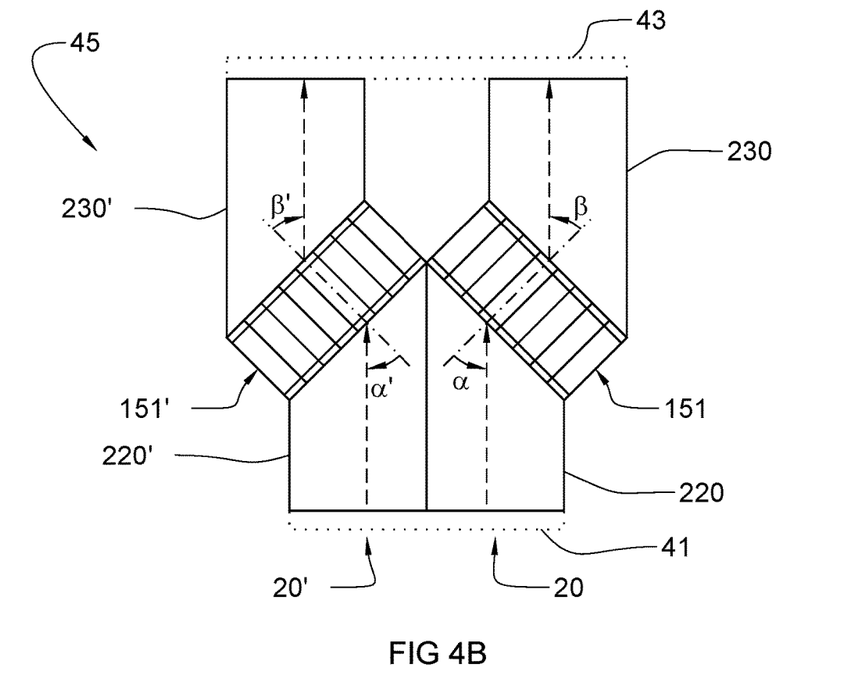
FIG. 4B represents another embodiment of a capacitor assembly according to the present disclosure wherein two assemblies of FIG. 2 are placed in antiparallel and used as repeating pattern.

Alternatively, referring to FIG. 4B, two patterns of FIG. 2 can be arranged in antiparallel, forming mirror symmetry with respect to one another. Capacitor assembly 20' is mirror symmetrical to capacitor assembly 20. The capacitor assembly 45 so obtained can be used as a pattern that can be repeated more than once, either as a series coupling, a parallel coupling, or a combination of both to obtain an even larger assembly. Conductive traces 220 and 220' are electrically in parallel and fed by a same source trace 41, and advantageously are conductively coupled to form a single, integral, conductive trace. Conductive traces 230 and 230' are electrically in parallel and can feed a same sink trace 43.

With the arrangement of FIG. 4B, the skew angle α' between the main current path through conductive trace 220' and the longitudinal axis 183 of the capacitor elements, and the skew angle α are of opposite sense, and advantageously of equal magnitude. Advantageous magnitudes for angles α, α', as well as β (and its counterpart in assembly 20') are between 20° and 70°, advantageously between 30° and 60°.

Figure 5:
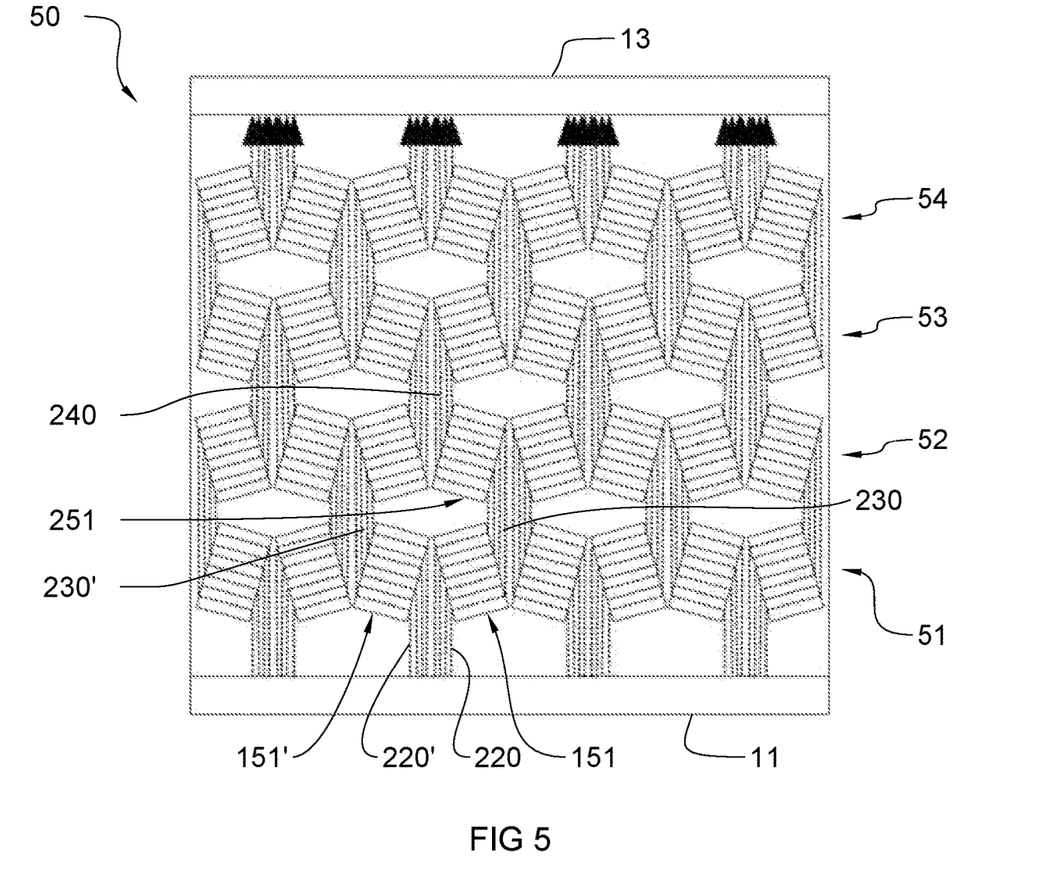
FIG. 5 represents yet a further embodiment of a capacitor assembly according to the present disclosure, wherein the assembly of FIG. 4B is used as a repeating pattern for the parallel connected capacitor rows and the assembly of FIG. 3A is used as a repeating pattern for the series connected capacitor rows in order to obtain a herring bone pattern.

The patterns of FIGS. 2 through 4B can be repeated when a plurality of capacitor rows 151, 151' must be placed electrically in series and/or in parallel. As a result, a capacitor assembly 50 comprising a honeycomb/diamond/chevron/ herring bone pattern of capacitor rows can be obtained as shown in FIG. 5. The pattern of assembly 50 can be obtained by arranging a plurality of capacitor assemblies 45 of FIG. 4B next to one another, electrically in parallel to form a first array 51. Additional capacitor assemblies 45 are then arranged in consecutive arrays 52-54, such that the conductive trace 230 of one array is connected to the conductive trace 220 of a consecutive array. The capacitor assemblies 45 in consecutive arrays 51-54 can be arranged in any suitable way. They can be identically repeated from one array to the consecutive one, they can be arranged in a staggered fashion, or they can be mirrored between consecutive arrays. A repeating pattern of capacitor layout is thereby advantageously obtained. The pattern of assembly 50 can alternatively be obtained by repeating the pattern of capacitor arrangement 30 of FIG. 3A. In that case, the capacitor rows 151 and 251 and conductive traces 220-240 are arranged two by two in mirror symmetry and the resulting pattern is repeated. As shown in FIG. 5, the conductive traces 220, 220' and 230, 230' connecting two consecutive arrays are arranged side by side in groups of two. The side by side conductive traces are advantageously conductively coupled.

It will be convenient to note that the skew angles α, β need not be the same and can evolve between series connected capacitor rows. This enables the capacitor assemblies according to the present disclosure to even better conform to the available space in an electrical circuit.

It will be convenient to note that the different rows of capacitor elements in the above examples can have, but need not have, an equal number of surface mounted capacitor elements. The number of capacitor elements in the rows of capacitors is not particularly limited and generally depends on the current rating. The rows of capacitors can comprise at least two, preferably at least four, or even more surface mounted capacitor elements. The number of rows connected in series is related to the voltage rating of the assembly. The number of rows connected in parallel is related to the current rating of the assembly.

The conductive traces 220, 230, and possibly the source and sink traces 31, 41 and 33, 43 can be integrated on the PCB 200, e.g. as metal layers of a multi-layer PCB.

A possible application of capacitor assemblies according to the present disclosure is as C-component of a LC circuit, also referred to as tank circuit. In particular, the capacitor assemblies can be used as capacitor components in a resonant tank circuit comprising an inductor configured for inductive transfer of electrical energy.

Figure 6:
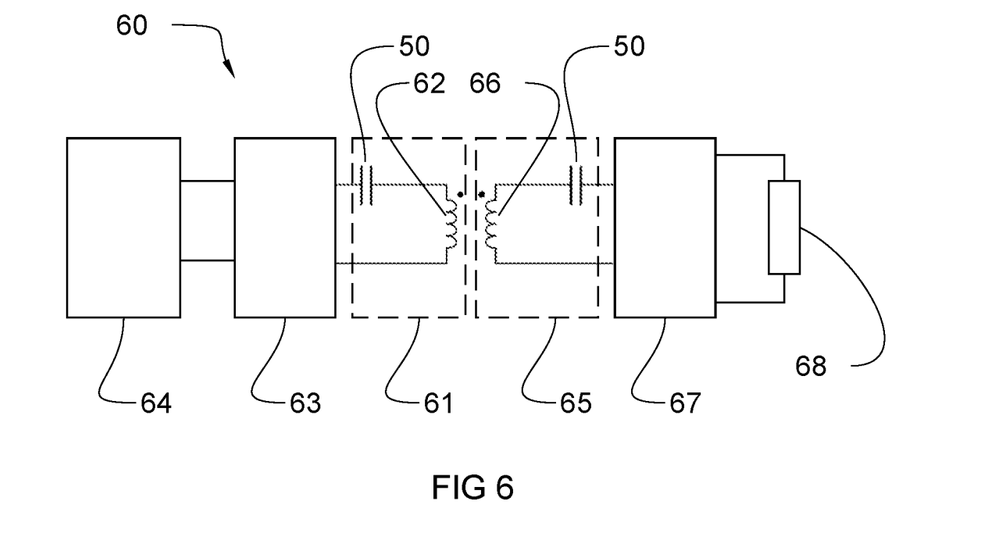
FIG. 6 represents a scheme for inductive transfer of electrical energy comprising a resonant tank circuit, wherein the resonant tank circuit comprises a capacitor assembly of the present disclosure.

Referring to FIG. 6, a system 60 for inductive transfer of electrical energy comprises a power transmission side and a power reception side. It will be convenient to note that system 60 can be operable for bidirectional transfer of electrical power. At the transmission side, system 60 comprises a resonant tank circuit 61 comprising the inductive power transfer coil 62 and a capacitor assembly according to the present disclosure, which can be any one of the capacitor assemblies described above, e.g. assembly 50. The capacitor assembly 50 can be arranged electrically in series (as shown in FIG. 6) or in parallel with coil 62. Additionally, more than one of such capacitor assemblies can be connected to coil 62, e.g. to create symmetry in the electrical circuit of coil 62. Resonant tank circuit 61 is connected to an inverter 63 for supplying an RF frequent power to the tank circuit 61. Inverter 63 can in turn be connected to a power supply 64. The power reception side can comprise a resonant tank circuit 65 which can be similar to the resonant tank circuit 61 of the transmission side. Tank circuit 65 comprises an inductive power transfer coil 66 configured to be inductively coupled to coil 62 for transferring power. Tank circuit 65 further comprises one or more capacitor assemblies, advantageously one or more capacitor assemblies according to the present disclosure, e.g. capacitor assembly 50. Tank circuit 65 is further coupled to a rectifier 67 configured for supplying rectified power to a load 68.

The invention claimed is:

1. A capacitor assembly, comprising:
a printed circuit board comprising a first conductive trace and a second conductive trace, and
a first row of capacitors comprising a plurality of surface mounted capacitor elements, wherein each of the plurality of surface mounted capacitor elements comprises a pair of outer electrodes,
wherein, of each of the plurality of surface mounted capacitor elements, one of the pair of outer electrodes is mounted to the first conductive trace and defines a first junction, and the other one of the pair of outer electrodes is mounted to the second conductive trace and defines a second junction,
wherein the first junction and the second junction define a first capacitor longitudinal axis,
wherein the first conductive trace has a first current flow direction with a first oblique angle ($\alpha$) relative to the first capacitor longitudinal axis.

2. The capacitor assembly according to claim 1, wherein the second conductive trace has a second current flow direction with a second oblique angle ($\beta$) relative to the first capacitor longitudinal axis.

3. The capacitor assembly according to claim 1, comprising a second row of capacitors connected in series with the first row of capacitors,
wherein the printed circuit board comprises a third conductive trace,
wherein the second row of capacitors comprises a plurality of surface mounted capacitor elements, wherein each of the plurality of surface mounted capacitor elements of the second row of capacitors comprises a pair of outer electrodes,
wherein, of each of the plurality of surface mounted capacitor elements of the second row of capacitors, one of the pair of outer electrodes is mounted to the second conductive trace and defines a third junction, and the other one of the pair of outer electrodes is mounted to the third conductive trace and defines a fourth junction,
wherein the third junction and the fourth junction define a second capacitor longitudinal axis,
wherein the second conductive trace has a second current flow direction with a third oblique angle ($\gamma$) relative to the second capacitor longitudinal axis.

4. The capacitor assembly according to claim 3, wherein the first oblique angle ($\alpha$) and the third oblique angle ($\gamma$) have opposite sign.

5. The capacitor assembly according to claim 3, wherein the second conductive trace has a second current flow direction with a second oblique angle ($\beta$) relative to the first capacitor longitudinal axis, wherein the third conductive trace has a third current flow direction with a fourth oblique angle (δ) relative to the second capacitor longitudinal axis, wherein the first oblique angle (α) and the second oblique angle (β) have opposite sign, and wherein the third oblique angle (γ) and the fourth oblique angle (δ) have opposite sign.

6. The capacitor assembly according to claim 3, wherein the first oblique angle (α) and the third oblique angle (γ) have equal absolute magnitude.

7. The capacitor assembly according to claim 1, comprising a third row of capacitors,
   wherein the printed circuit board comprises a fourth conductive trace and a fifth conductive trace,
   wherein the third row of capacitors comprises a plurality of surface mounted capacitor elements, wherein each of the plurality of surface mounted capacitor elements of the third row of capacitors comprises a pair of outer electrodes,
   wherein, of each of the plurality of surface mounted capacitor elements of the third row of capacitors, one of the pair of outer electrodes is mounted to the fourth conductive trace and defines a fifth junction, and the other one of the pair of outer electrodes is mounted to the fifth conductive trace and defines a sixth junction,
   wherein the fifth junction and the sixth junction define a third capacitor longitudinal axis,
   wherein the fourth conductive trace has a fourth current flow direction having a fifth oblique angle (α') relative to the third capacitor longitudinal axis.

8. The capacitor assembly according to claim 7, wherein the third row of capacitors is arranged electrically in parallel to the first row of capacitors.

9. The capacitor assembly according to claim 3, wherein the first row of capacitors, the second row of capacitors, the first conductive trace, the second conductive trace and the third conductive trace form a capacitor arrangement, wherein the capacitor assembly comprises a plurality of the capacitor arrangements arranged electrically in parallel on the printed circuit board.

10. The capacitor assembly according to claim 9, wherein respective ones of the first oblique angle (α) and the third oblique angle (γ) of the plurality of the capacitor arrangements have equal absolute magnitude.

11. The capacitor assembly according to claim 9, wherein the plurality of the capacitor arrangements comprises juxtaposed capacitor arrangements, wherein respective ones of the first oblique angle (α, α') and the third oblique angle of the juxtaposed capacitor arrangements have alternating sign.

12. The capacitor assembly according to claim 11, wherein the juxtaposed capacitor arrangements have respective first, second and third conductive traces that are alternatingly conductively coupled.

13. The capacitor assembly according to claim 3, wherein the first and second rows of capacitors comprise a same number of surface mounted capacitors.

14. The capacitor assembly according to claim 3, wherein a current flow direction in the second conductive trace is defined as a straight line between corresponding outer electrodes in the second and the third junctions arranged at opposite ends of the second conductive trace.

15. The capacitor assembly according to claim 1, wherein the absolute magnitude of the first oblique angle (α) is between 20° and 70°.

16. The capacitor assembly according to claim 1, wherein the first and the second conductive traces are arranged in one or more layers of the printed circuit board.

17. An electrical circuit, comprising:
   a power supply; and
   the capacitor assembly of claim 1;
   wherein the capacitor assembly is connected to the power supply such that a substantial amount of power emitted by the power supply is configured to flow through the capacitor assembly during operation.

18. An electrical circuit, comprising an inductor and at least one capacitor assembly of claim 1, wherein the inductor and the at least one capacitor assembly form an LC circuit.

19. The capacitor assembly according to claim 5, wherein the first oblique angle (α), the third oblique angle (γ) and one or both of the second oblique angle (β) and the fourth oblique angle (δ) have equal absolute magnitude.

20. The capacitor assembly according to claim 1, wherein the absolute magnitude of the first oblique angle (α) is between 30° and 60°.

* * * * *